US 7,855,861 B2

(12) United States Patent
Dang et al.

(10) Patent No.: US 7,855,861 B2
(45) Date of Patent: Dec. 21, 2010

(54) INSULATOR BARRIER FOR NOISE REDUCTION OF A TMR MAGNETIC TRANSDUCER

(75) Inventors: Peter M. Dang, San Jose, CA (US); Eric W. Flint, San Jose, CA (US); Daryl J. Pocker, San Jose, CA (US); Yongjian Sun, San Jose, CA (US); Jila Tabib, Los Gatos, CA (US); Brian R. York, San Jose, CA (US)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 880 days.

(21) Appl. No.: 11/799,235

(22) Filed: Apr. 30, 2007

(65) Prior Publication Data

US 2008/0266719 A1    Oct. 30, 2008

(51) Int. Cl.
G11B 5/127 (2006.01)
G11B 5/39 (2006.01)
(52) U.S. Cl. ............... 360/324.2; 428/811.1; 428/692.1
(58) Field of Classification Search ............. 428/811.1, 428/692.1, 693.1, 632–633, 640, 698, 702; 360/324.2
See application file for complete search history.

(56) References Cited

U.S. PATENT DOCUMENTS

| | | | |
|---|---|---|---|
| 4,196,255 A | 4/1980 | Suzuki et al. | |
| 5,763,087 A | 6/1998 | Falabella | |
| 5,795,660 A | 8/1998 | Yoshimi et al. | |
| 6,001,480 A | 12/1999 | Sho | |
| 6,368,706 B1 * | 4/2002 | Iwasaki et al. | 428/332 |
| 6,710,986 B1 * | 3/2004 | Sato et al. | 428/811.1 |
| 6,756,128 B2 * | 6/2004 | Carey et al. | 428/811.1 |
| 7,208,227 B2 | 4/2007 | Tomihashi et al. | |
| 7,300,711 B2 * | 11/2007 | Parkin | 428/811.1 |
| 7,672,094 B2 * | 3/2010 | Shatz et al. | 360/324.2 |
| 2007/0041132 A1 | 2/2007 | Tondokoro et al. | |
| 2008/0253039 A1 * | 10/2008 | Nagamine et al. | 360/324.2 |
| 2008/0266715 A1 * | 10/2008 | Bhatia et al. | 360/235.4 |
| 2008/0266719 A1 * | 10/2008 | Dang et al. | 360/313 |
| 2008/0316656 A1 * | 12/2008 | Miyata et al. | 360/324.2 |
| 2009/0134450 A1 * | 5/2009 | Kim et al. | 257/325 |
| 2009/0166182 A1 * | 7/2009 | Noma | 204/192.1 |
| 2009/0257149 A1 * | 10/2009 | Lee et al. | 360/314 |

* cited by examiner

Primary Examiner—Brian E Miller

(57) ABSTRACT

A hard disk drive slider comprises an overcoat layer, which covers an air-bearing surface of the slider. The overcoat covers an exposed surface of a tunneling magnetoresistance transducer. An adhesion layer is coupled with the overcoat layer and the air-bearing surface. The adhesion layer comprises a compound of nitrogen. The compound of nitrogen reduces noise in read data from the tunneling magnetoresistance transducer.

12 Claims, 16 Drawing Sheets

INSULATOR BARRIER FOR NOISE REDUCTION OF A TMR MAGNETIC TRANSDUCER

RELATED APPLICATIONS

This application is related to U.S. patent application Ser. No. 11/799,296, entitled "SLIDER OVERCOAT FOR NOISE REDUCTION OF TMR MAGNETIC TRANSDUCER" by Charanjit Bhatia, et al, filed Apr. 30, 2007, assigned to the assignee of the present invention.

TECHNICAL FIELD

This invention relates generally to the field of direct access storage devices and in particular to the fabrication and performance of TMR magnetic recording transducers.

BACKGROUND ART

Direct access storage devices (DASD) have become part of every day life, and as such, expectations and demands continually increase for better performance at lower cost. To meet these demands, the mechano-electrical assembly in a DASD device, specifically the Hard Disk Drive (HDD) has evolved to meet these demands.

In order for an HDD to hold more data, advances in the disk media in which the data is written as well as the magnetic transducer for writing and reading the data have undergone major advances in the past few years.

The magnetic transducer used in the first hard disk drives was based on an inductive principle for both writing and reading data to and from the disk media. For writing data into the disk media, electric current is passed through an electrically conductive coil, which is wrapped around a ferromagnetic core. The electric current passing through the write coil induces a magnetic field in the core, which magnetizes a pattern of localized spots in the disk media as the disk media passes close to the magnetic transducer. The pattern of magnetized spots in the media forms data that can be read and manipulated by the HDD. To read this data, the disk passes the magnetized spots of written data close to the same magnetic core used for writing the data. The magnetized spots passing close to the ferromagnetic core induce a magnetic field in the core. The magnetic field induced in the ferromagnetic core induces an electric current in a read coil similar to the write coil. The HDD interprets the induced electric current from the read coil as data.

Magnetoresistance (MR) transducers replaced inductive read heads. An MR transducer reads written data in disk media, still in the form of magnetized spots, by sensing the change in electrical resistance of a magneto-resistive element in the MR transducer. An electric current is passed through an MR transducer. The current typically traverses the MR transducer perpendicularly to the direction of disk rotation.

Advances in the magneto-resistive element materials have made the MR transducer more sensitive and is now referred to as a giant magnetoresistance (GMR) transducer. As with the MR transducer, the current typically traverses the GMR transducer perpendicularly to the direction of disk rotation, and the data is written in the disk media with an inductive write transducer.

Further advances in magneto-resistive reading have given rise to tunneling magnetoresistance (TMR) magnetic transducers. The current traversing the TMR magnetic transducer is typically parallel to the direction of disk rotation. A thin insulator barrier is placed between two ferromagnetic conductors. Electrons tunnel through the thin insulator barrier. The resistance of the electrons tunneling through the thin insulator barrier will change as the magnetic domain structure within the two ferromagnetic conductors react to the presence of a magnetized spot in the disk media. In this manner, data can be read that has been magnetically written in the disk media.

Continuing advances are being made in the TMR magnetic transducer design and fabrication methods as more demands are made on the performance of HDDs using TMR magnetic transducers.

SUMMARY OF THE INVENTION

Various embodiments of the present invention are described herein. A hard disk drive slider comprises a tunneling magnetoresistance transducer, which comprises an insulator barrier. A nitrogen atom from a nitrogen atmosphere occupies an oxygen atom vacancy within the insulator barrier, such that noise in read data from the tunneling magnetoresistance transducer is reduced.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the alternative embodiment(s) of the present invention. While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of embodiments of the present invention, numerous specific details are set forth in order to provide a thorough understanding of the present invention. However, it will be recognized by one of ordinary skill in the art that embodiments of the present invention may be practiced without these specific details. In other instances, well known methods, procedures, and components have not been described in detail as not to unnecessarily obscure aspects of the present invention.

The discussion will begin with a brief overview of a TMR magnetic transducer used in an HDD and the newly discovered effects that an overcoat process and trimming processes during fabrication have on the performance of a TMR magnetic transducer. The discussion will then focus on embodiments of the present invention that solve deleterious effects that the overcoat and trimming processes have on the TMR magnetic transducer performance. The implementation of embodiments of the present invention will then be discusses.

Overview

Figure 1:
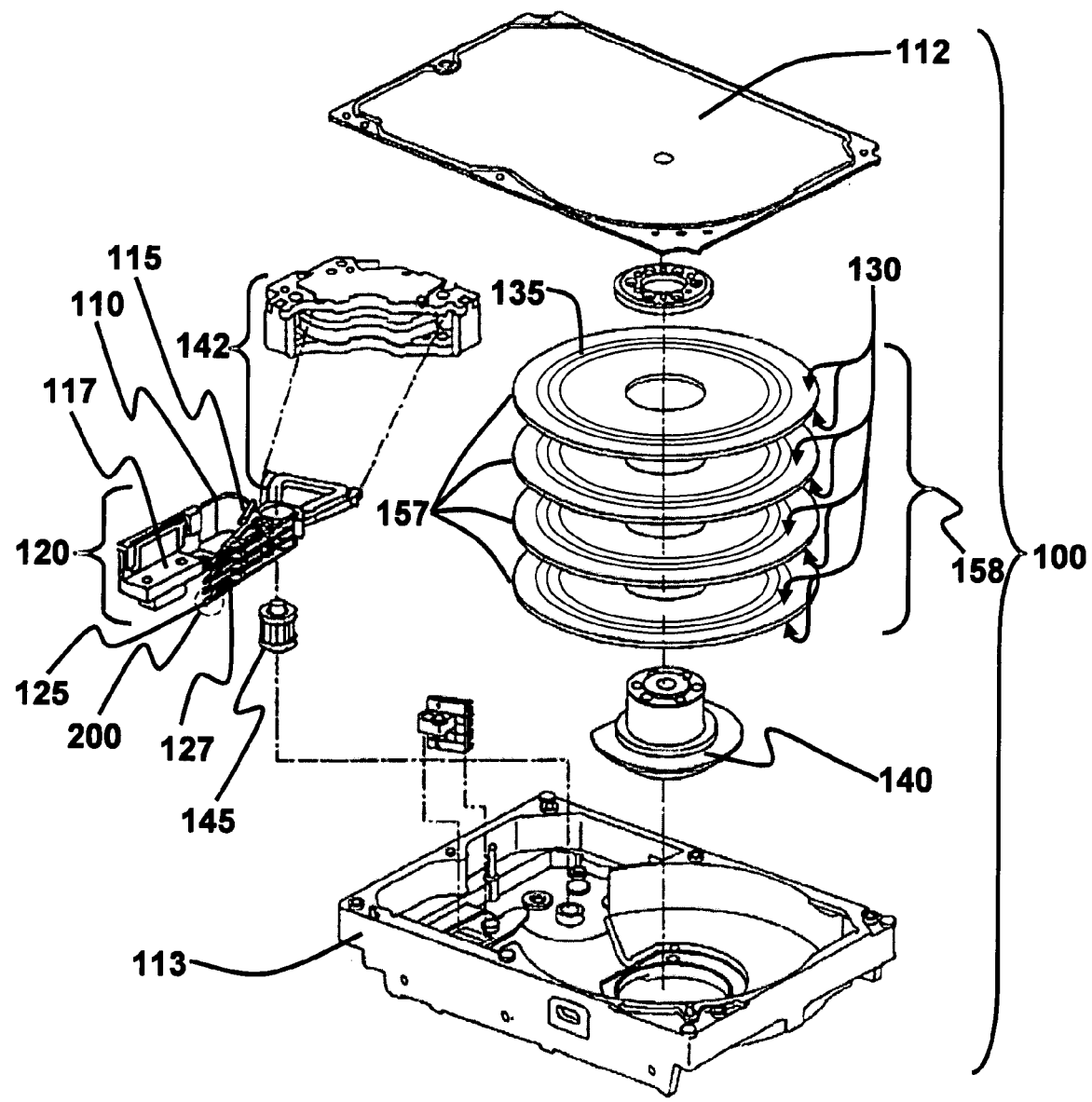
FIG. 1 is an isometric blow-apart of an HDD in accordance with one embodiment of the present invention.

With reference to FIG. 1, an isometric blow-apart of HDD 100 is shown in accordance with an embodiment of this invention. Base casting 113 provides coupling points for components and sub-assemblies such as disk stack 158, voice coil motor (VCM) 142, and actuator assembly 120. Disk stack 158 is coupled to base casting 113 by means of motor-hub assembly 140. Motor-hub assembly 140 will have at least one disk 157 coupled to it whereby disk 157 can rotate about an axis common to motor-hub assembly 140 and the center of disk 157. Disk 157 has at least one surface 130 upon which reside data tracks 135. Actuator assembly 120 comprises in part suspension 127, which suspends hard disk drive slider 125 next to disk surface 130, and connector 117, which conveys data between arm electronics (A/E) 115 and a host system wherein HDD 100 resides. Flex cable 110, which is part of actuator assembly 120, conveys data between connector 117 and A/E 115.

Actuator assembly 120 is coupled pivotally to base casting 113 by means of pivot bearing 145, whereby VCM 142 can move HDD slider 125 arcuately across data tracks 135. Upon assembly of actuator assembly 120, disk stack 158, VCM 142, and other components with base casting 113, cover 112 is coupled to base casting 113 to enclose these components and sub-assemblies into HDD 100.

Figure 2:
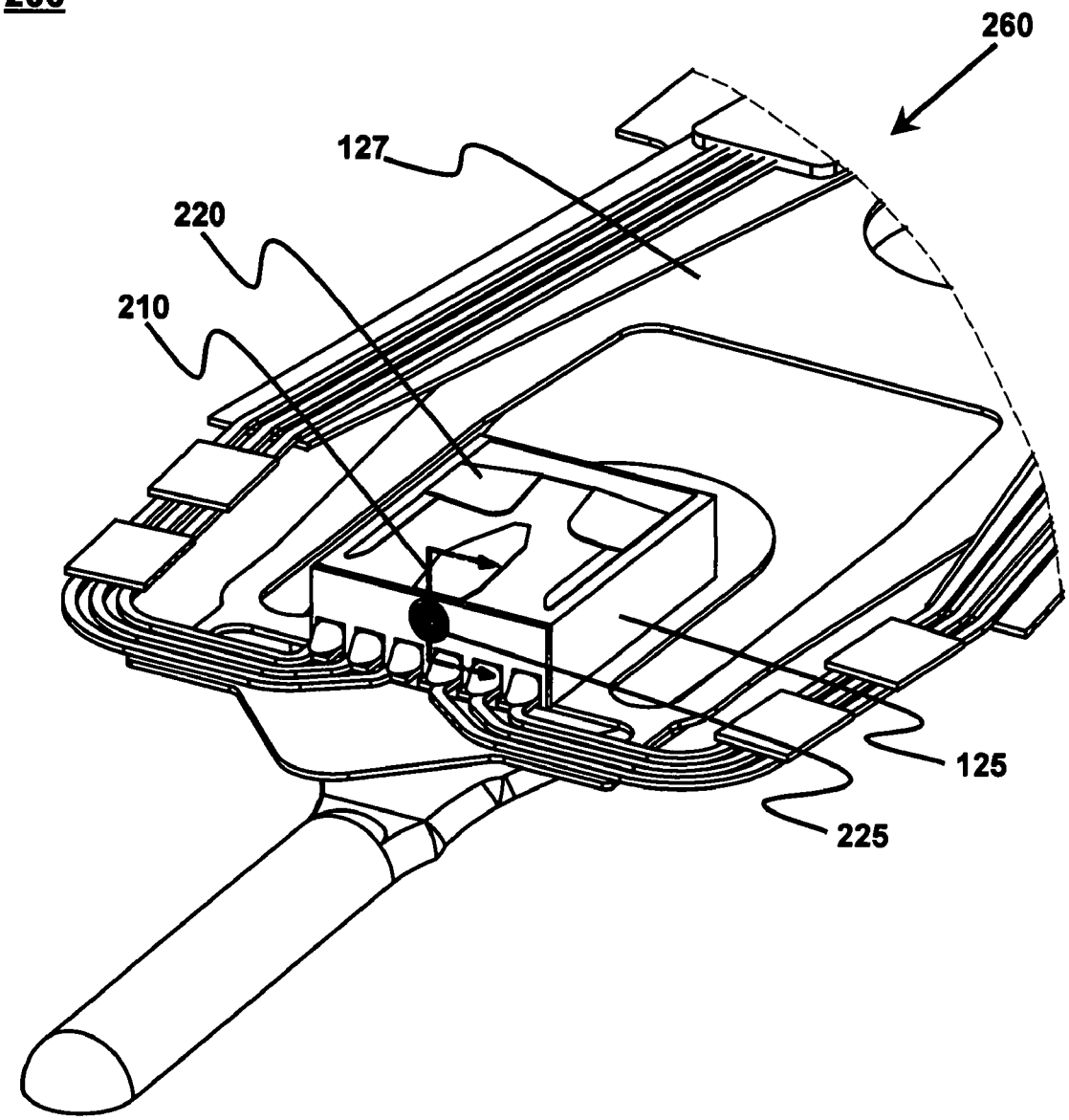
FIG. 2 is an isometric detail of an HDD slider in accordance with one embodiment of the present invention.

With reference to FIG. 2, an isometric detail 200 of HGA 260 is presented in accordance with an embodiment of the present invention. Detail 200 is the most distal end of HGA 260 comprising suspension 127 and HDD slider 125. Slider 125 comprises magnetic transducer 225, which writes and reads data tracks 135 onto disk surface 130, and air-bearing surface (ABS) 220, which in cooperation with suspension 127 provides a proper balance of forces, whereby magnetic transducer 225 is closely spaced from disk surface 130 by a film of air.

Figure 3:
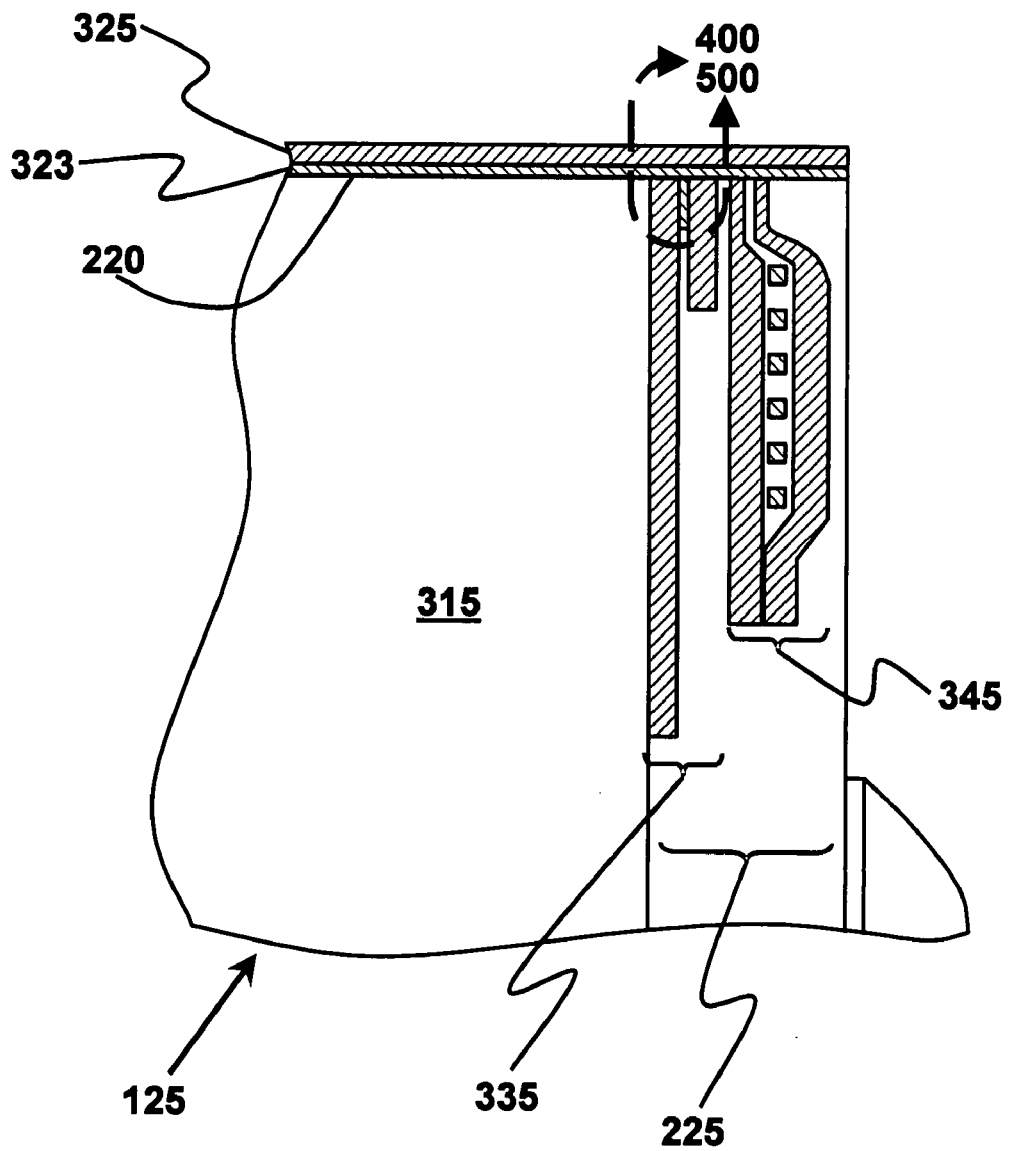
FIG. 3 is a cross-section of an HDD slider in accordance with one embodiment of the present invention.

With reference now to FIG. 2 and FIG. 3, section line 210 and cross-section 300 bisects magnetic transducer 225 and reveals in cross-section inductive write transducer 345 and TMR magnetic read transducer 335. TMR transducer 335 and inductive write transducer 345 are exposed at ABS 220. Cross-section 300 of slider 125 is presented in accordance with one embodiment of the present invention. Cross-section 300 is not to scale. Feature sizes are exaggerated to facilitate their presentation.

ABS 220 includes exposed surfaces of magnetic transducer 225. Magnetic transducer 225 comprises inductive write transducer 345 and TMR magnetic read transducer 335. The exposed surfaces of magnetic transducer 225 are typically at a location on ABS 220 that is positioned closest to disk surface 130. Occasionally ABS 220 may contact disk surface 130 and possibly damage magnetic transducer 225. To prevent such damage, a protective covering known as overcoat 325 is applied to ABS 220.

Overcoat 325 can be made with various types of carbon layers known to those skilled in the art, such as Filtered Cathodic Arc Carbon (FCAC) and Diamond-Like Carbon (DLC). The scope of the embodiment of the present invention is not limited to FCAC and DLC. FCAC and DLC are presented only as examples of carbon layers used in the art of fabricating an overcoat. The scope of the embodiment of the present invention includes in the overcoat, any layer typically applied to ABS 220. This includes but is not limited to adhesion layer 323 and/or carbon layer 324.

Physical Description

Figure 4:
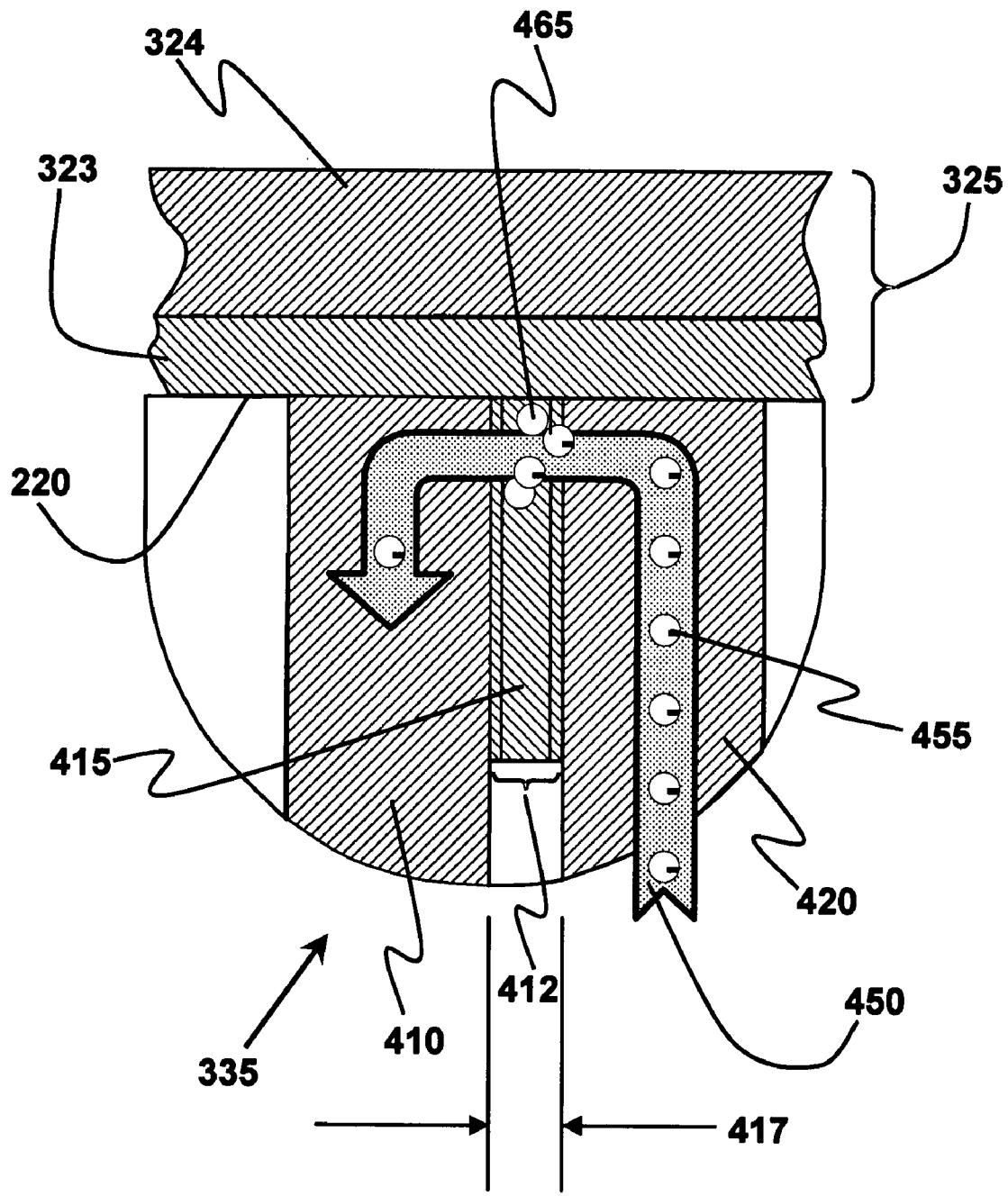
FIG. 4 is a cross-section of a detail of an HDD slider in accordance with one embodiment of the present invention.

With reference to FIG. 4, detail 400 of cross-section 300 of slider 125, is presented in accordance with an embodiment of the present invention. Detail 400 is a detail of TMR transducer 335. TMR transducer 335 comprises first ferromagnetic lead 410, TMR stack 412, and second ferromagnetic lead 420. Typically first and second ferromagnetic leads (410, 420) comprise cobalt-iron (CoFe). The embodiment of the present invention is not dependent upon the use of CoFe in the ferromagnetic leads. CoFe is only presented as an example of a ferromagnetic material. Another example of a typical ferromagnetic material used in a TMR magnetic transducer is nickel-iron (NiFe). In general, the ferromagnetic material used in a TMR magnetic transducer typical comprises a compound of iron (Fe).

Carbon layer 324 is expected to adhere to a variety of materials comprising ABS 220, e.g. slider body 315, which is typically an amalgam of alumina and titanium carbide, ferromagnetic leads (410, 420), TMR stack 412, and various metal compounds and ceramics comprising magnetic transducer 225, which comprise ABS 220. To enhance the adhesion of carbon layer 324 to ABS 220, adhesion layer 323 is typically coupled to carbon layer 324 and ABS 220. Adhesion layer 323 is typically a layer of silicon (Si).

TMR stack 412 is fabricated with a variety of layers. TMR stack 412 typically comprises an insulator barrier 415 of magnesium-oxide (MgO), titanium-oxide ($TiO_2$), or alumina ($Al_2O_3$). The insulating barrier material is approximately stoichiometric and is fabricated to thickness 417 that is approximately 10 Å. The scope of the embodiment of the present invention is not limited by material used for insulator barrier 415. MgO, $TiO_2$, and $Al_2O_3$ are presented only as examples of compounds that may comprise insulator barrier 415 in TMR magnetic transducer 335. In general, the insulator barrier material in a TMR stack used in a TMR magnetic transducer typical comprises a compound of oxygen (O).

In operation, electric current 450 is applied between first and second ferromagnetic leads (410, 420). By virtue of thickness 417 being sufficiently small, electrons 455 can tunnel through insulator barrier 415 and between first and second ferromagnetic leads (410, 420). The ability of electric current 450 to flow between first and second ferromagnetic leads (410, 420) can be measured as electrical resistance. Electrical resistance will change when TMR magnetic transducer 335 is adjacent to a magnetic field, such as that present in magnetic data encoded in data tracks 135 (FIG. 1).

Ideally the electrical resistance measured from TMR magnetic transducer 335 changes only in the presence of a magnetic field. In reality, there are variations in electrical resistance that can occur in an uncontrolled manner. These variations are typically referred to as read-back signal noise. The sources and causes of noise are varied. Noise in an individual TMR transducer can make its performance unreliable. Noise that varies between groups of TMR transducers can make supporting electronics such as A/E 115 (FIG. 1) non-functional for some TMR transducers.

A recent discovery has found that a cause for this read-back signal noise is due to damage inflicted upon TMR stack 412 such as oxygen atoms being dislodged from insulator barrier 415 and causing oxygen vacancy 465. As electric current 450 is applied between first and second ferromagnetic leads (410, 420), oxygen vacancy 465 may trap electrons 455 and inhibit their ability to tunnel through insulator barrier 415. It has also been discovered that a cleaning process performed just prior to the application of adhesion layer 323 can cause damage to TMR stack 412. The cleaning process prior to application of adhesion layer 323 is typically a sputter etch process, well known in the art. It has been discovered that the sputter etch process causes damage to TMR stack 412 such as dislodging oxygen from the oxygen compound in insulator barrier 415. Oxygen vacancy 465 typically occur closest to ABS 220, since this is the surface that receives the sputter etch process prior to the application of adhesion layer 323.

One possible approach to eliminating oxygen vacancy 465 is to introduce oxygen into oxygen vacancy 465. A possible deleterious result of introducing oxygen is the oxidation (corrosion) of first and second ferromagnetic leads (410, 420), which typically comprise a compound of Fe such as CoFe or NiFe. It is well known in the art that Fe is readily oxidized in the presence of oxygen. For this reason it is customary practice in the art to be cautious with compounds or atmospheres containing oxygen that may come into contact with an unprotected ferromagnetic compound.

In accordance with one embodiment of the present invention, oxygen vacancy 465 is filled with nitrogen. A recent discovery has found that MgO absorbs nitrogen (N) in TMR stack 412 that has been damaged such as when oxygen vacancy 465 exists. Although there is a preferential absorption of oxygen by MgO, nitrogen will also be absorbed by MgO.

Figure 5:
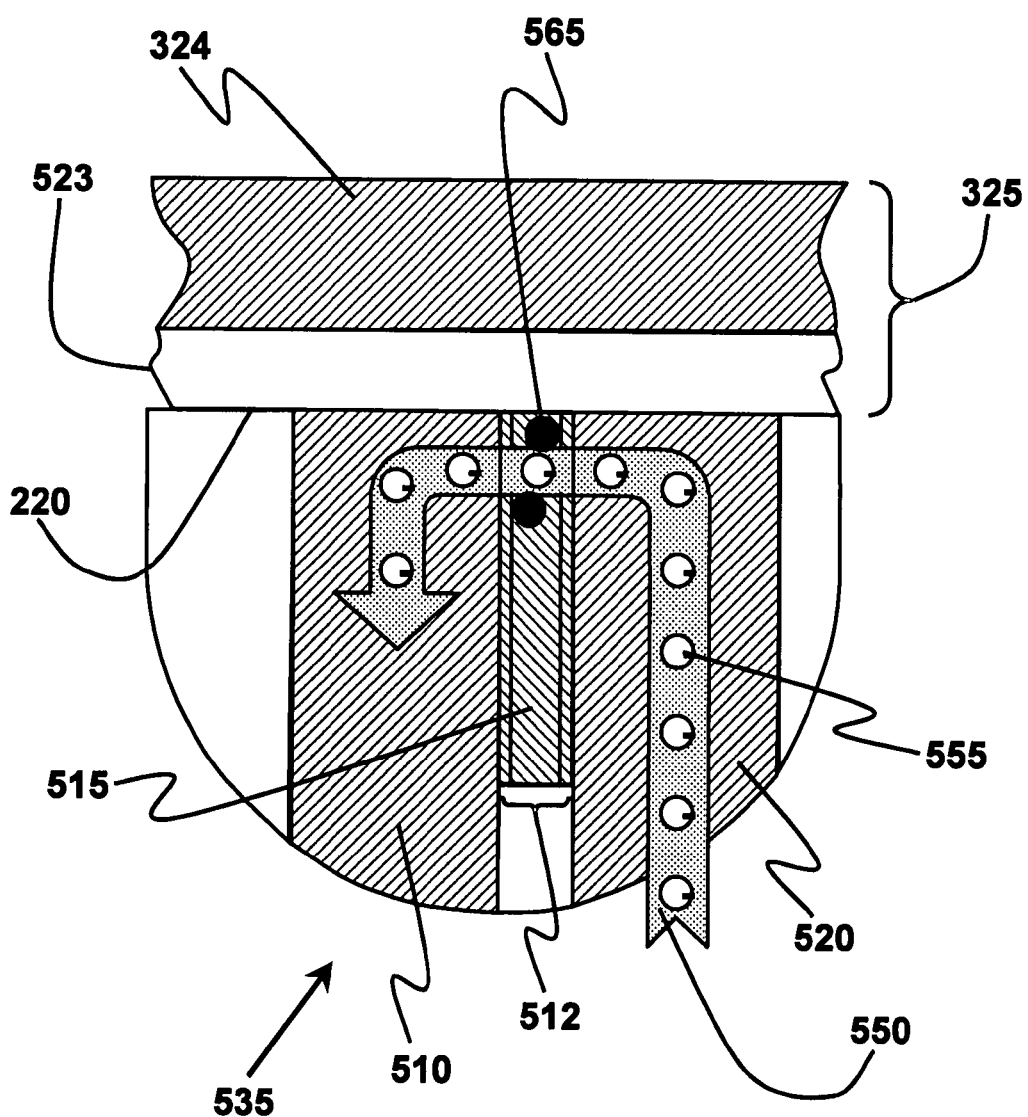
FIG. 5 is a cross-section of a detail of an HDD slider in accordance with one embodiment of the present invention.

With reference to FIG. 5, detail 500 of cross-section 300 of slider 125, is presented in accordance with an embodiment of the present invention. Detail 500 is a detail of TMR transducer 535, which has reduced read-back signal noise due to damage to TMR stack 512. Nitrogen atoms from adhesion layer 523 repair damaged TMR stack 512, for example by filling oxygen vacancy 565 in insulator barrier 515 with nitrogen atoms from adhesion layer 523 Approximately stoichiometric $SiN_x$ is typically a stable compound. By adhesion layer 323 comprising $SiN_x$, Si is bound to N and is prevented from grabbing oxygen atoms from insulator barrier 515.

As electric current 550 is applied between first ferromagnetic lead 510 and second ferromagnetic lead 520, nitrogen filled oxygen vacancy 565 cannot trap electrons 555 and thus reduces the variations in resistance of current 550 and thereby reduces read-back signal noise from TMR transducer 535.

The term "x" in $SiN_x$ is the number of nitrogen atoms bound to silicon atoms to form a compound of nitrogen and silicon. The effective range of "x" to fill oxygen vacancy 565 with nitrogen is 1.03 to 1.63. The preferred range of "x" to fill oxygen vacancy 565 with nitrogen is 1.11 to 1.43. The resulting compound of silicon and nitrogen is approximately stoichiometric silicon-nitride, $Si_3N_4$.

It has also been discovered that a source of nitrogen atoms for filling oxygen vacancies can also be an atmosphere of gas or an atmosphere of plasma. In accordance with another embodiment of the present invention, the source of nitrogen for filling oxygen vacancies is an atmosphere comprising nitrogen, such as an atmosphere of nitrogen gas, nitric oxide gas, nitrogen plasma, or nitric oxide plasma. The atmosphere comprising nitrogen is back-filled into a sputtering chamber prior to the deposition of an adhesion layer. In accordance with an embodiment of the present invention, the adhesion layer is not required to comprise a compound of nitrogen in order to fill oxygen vacancies, since the atmosphere comprising nitrogen is the source of nitrogen. The adhesion layer may comprise a compound such as Si or $SiO_2$. By exposing an insulator barrier that has been damaged, the TMR transducer previously described in HDD slider 125 may be repaired, and thus reduce read-back signal noise from the TMR transducer.

Possible damage to TMR stack 412 is not restricted to the overcoat process. Any process during the fabrication of TMR magnetic transducer 335, which exposes TMR stack 412 to a ionizing process such as sputter etching, ion milling, or reactive ion etching (RIE), can possibly damage TMR stack 412, such as creating oxygen vacancy 465.

Figure 6:
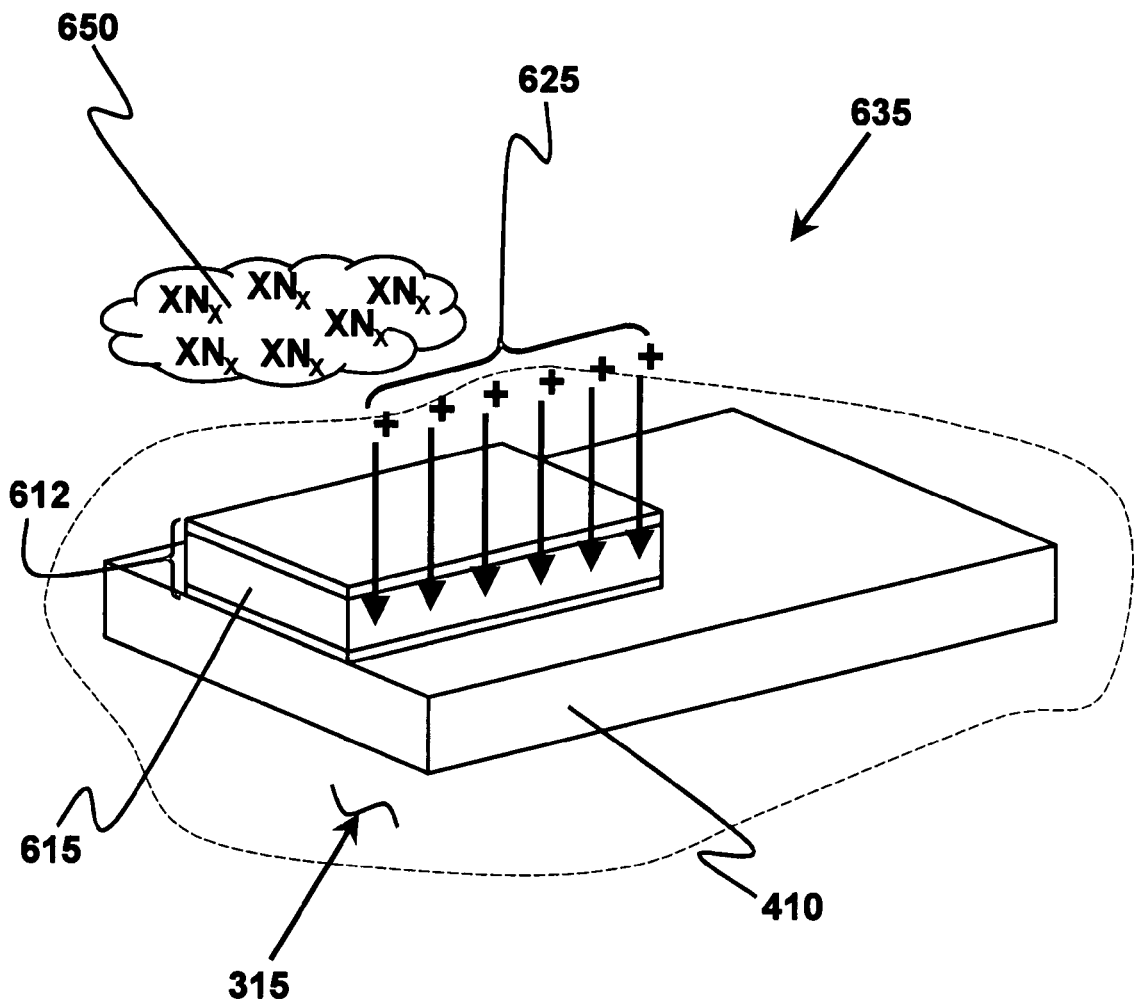
FIG. 6 is an isometric view of a TMR transducer of an HDD slider in accordance with one embodiment of the present invention.

With reference to FIG. 6, an isometric view of TMR transducer 635 of HDD slider 125 is presented in accordance with an embodiment of the present invention. First ferromagnetic lead 410 is deposited on the surface of slider body 315. TMR stack 612 is deposited on to first ferromagnetic lead 410 TMR stack 612 is trimmed by means of plasma 625. Examples of plasma known in the art are ion milling or reactive ion etching (RIE). Exposing TMR stack 612 to plasma may damage TMR stack 615 and cause variations in resistance through TMR stack 615, resulting in read-back signal noise from TMR transducer 635.

In accordance with an embodiment of the present invention, damaged TMR stack 612 of TMR transducer 635 may be repaired by exposing TMR stack 615 to atmosphere 650 comprising nitrogen, such as an atmosphere of nitrogen or nitric oxide. Upon repairing TMR stack 612, a subsequent layer may be deposited onto TMR stack 612.

Figure 7:
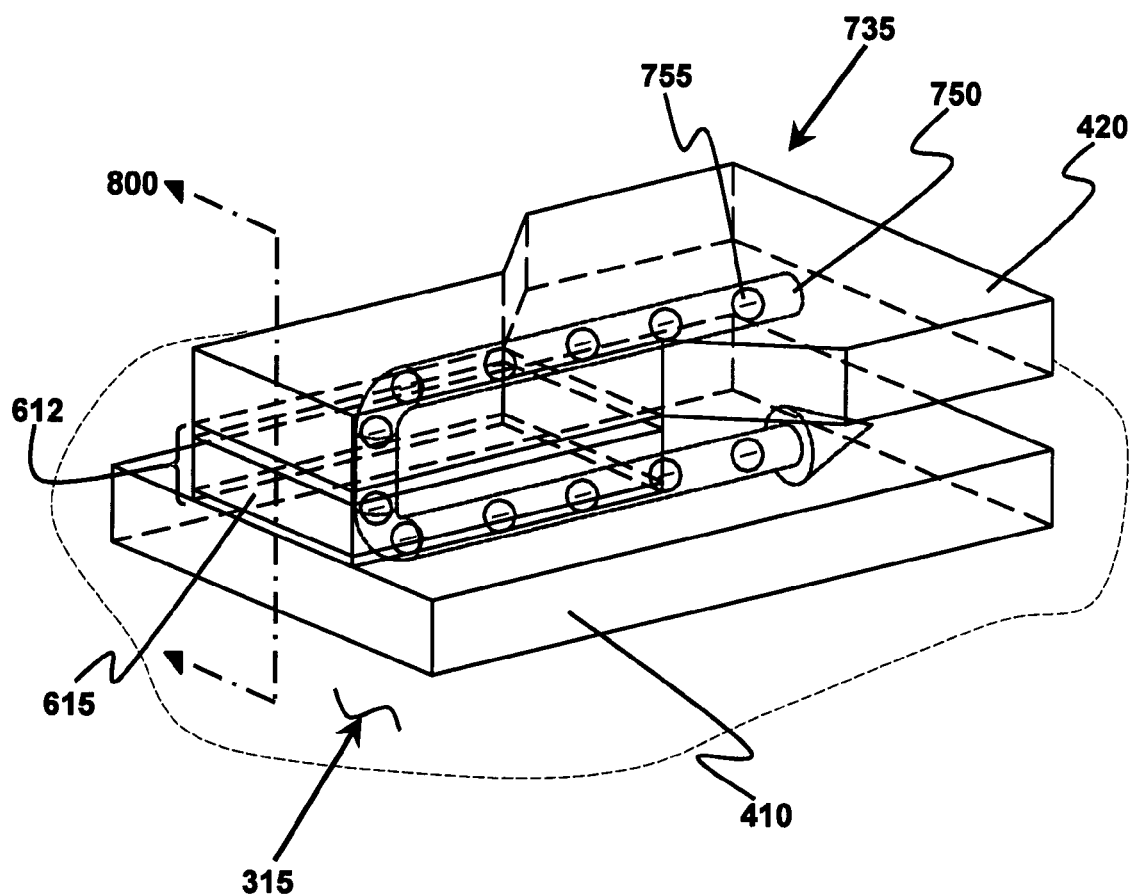
FIG. 7 is an isometric view of a repaired TMR transducer of an HDD slider in accordance with one embodiment of the present invention.

With reference to FIG. 7, an isometric view of a repaired TMR transducer 735 of HDD slider 125 is presented in accordance with an embodiment of the present invention. Second ferromagnetic lead 420 is deposited subsequently on a surface of TMR stack 612 after being repaired with atmosphere 650. TMR stack 615 may also be repaired with atmosphere 650 after a subsequent layer such as second ferromagnetic lead 420 has been deposited. Similarly as presented in FIG. 5, and analogues to electric current 550 and electrons 555, electrons 755 are not trapped by oxygen vacancies in repaired TMR stack 612 and thus reduce the variations in resistance to current 750 and thereby reduce read-back signal noise from a magnetic transducer using TMR transducer 735.

Figure 8:
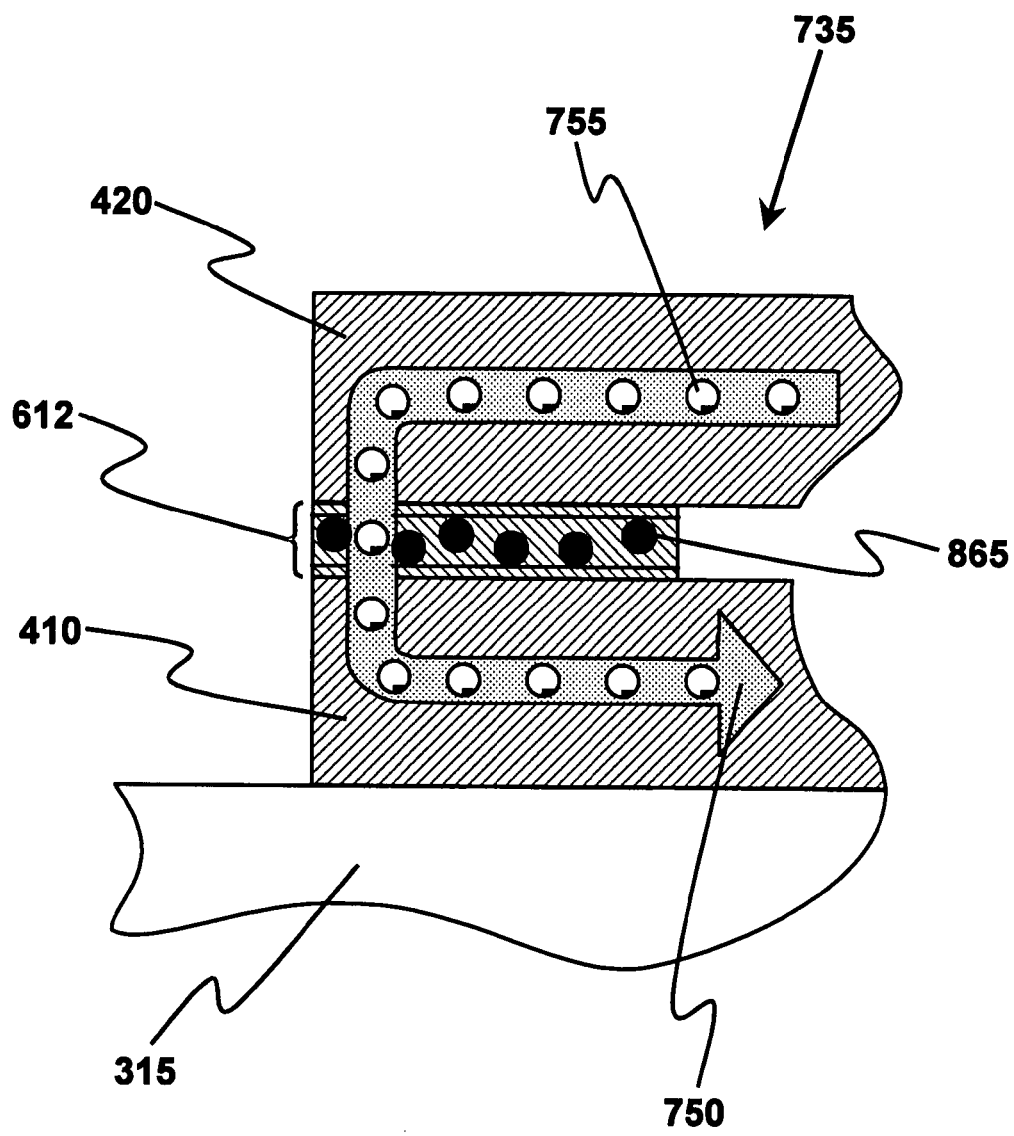
FIG. 8 is a cross-section of a TMR transducer of an HDD slider in accordance with one embodiment of the present invention.
Figure 9:
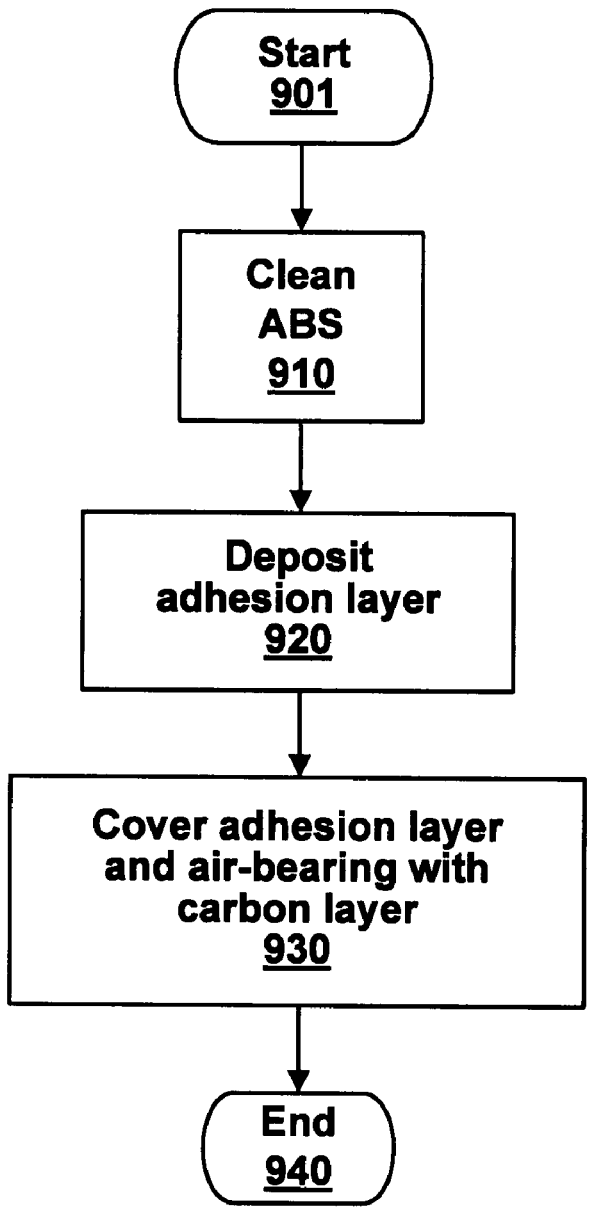
FIG. 9 is a flow chart illustrating steps of a fabrication process for an HDD slider in accordance with one embodiment of the present invention.
Figure 10:
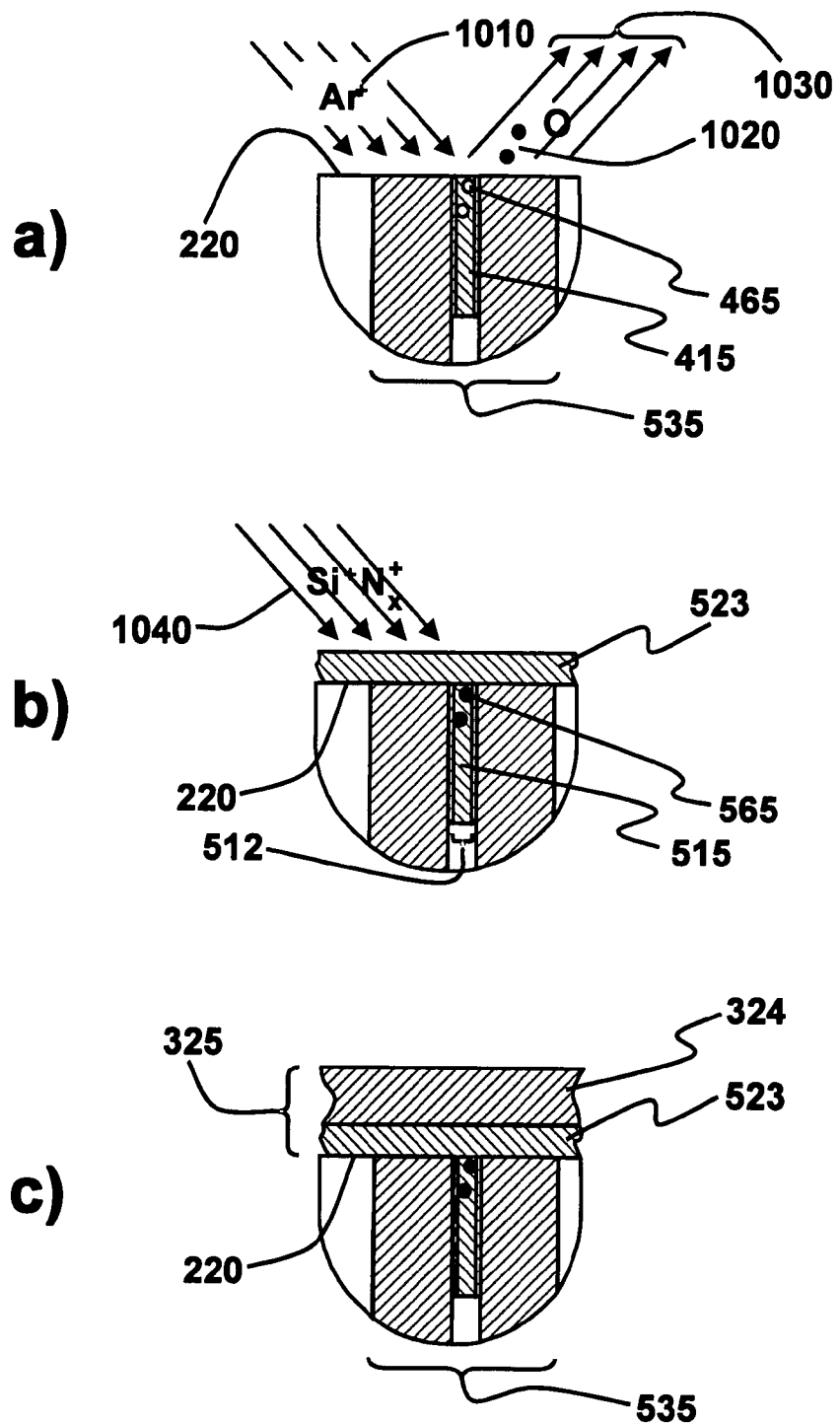
FIG. 10(a-c) are cross-sections of a detail of an HDD slider at process steps of fabrication in accordance with one embodiment of the present invention.
Figure 11:
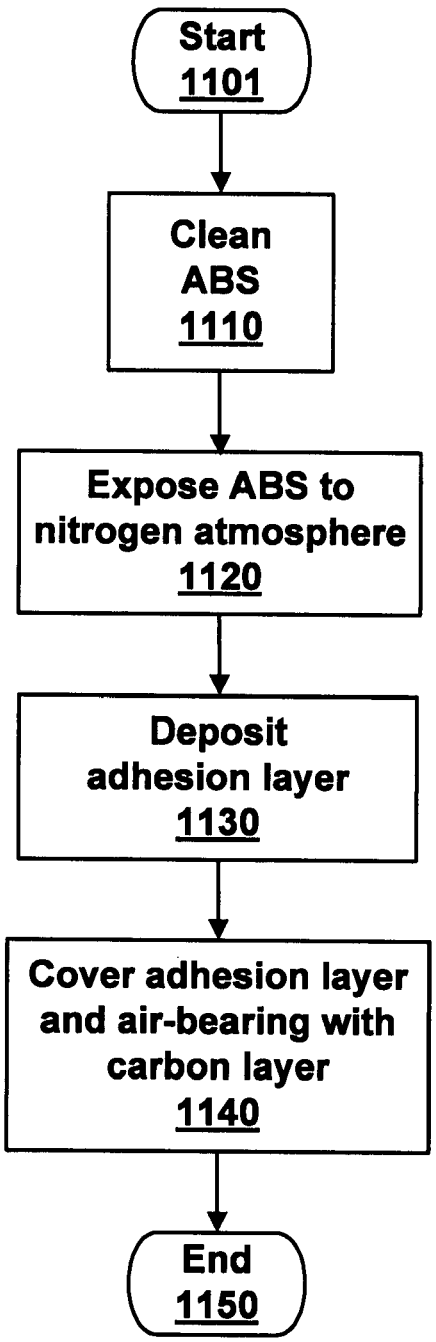
FIG. 11 is a flow chart illustrating steps of a fabrication process for an HDD slider in accordance with one embodiment of the present invention.
Figure 12:
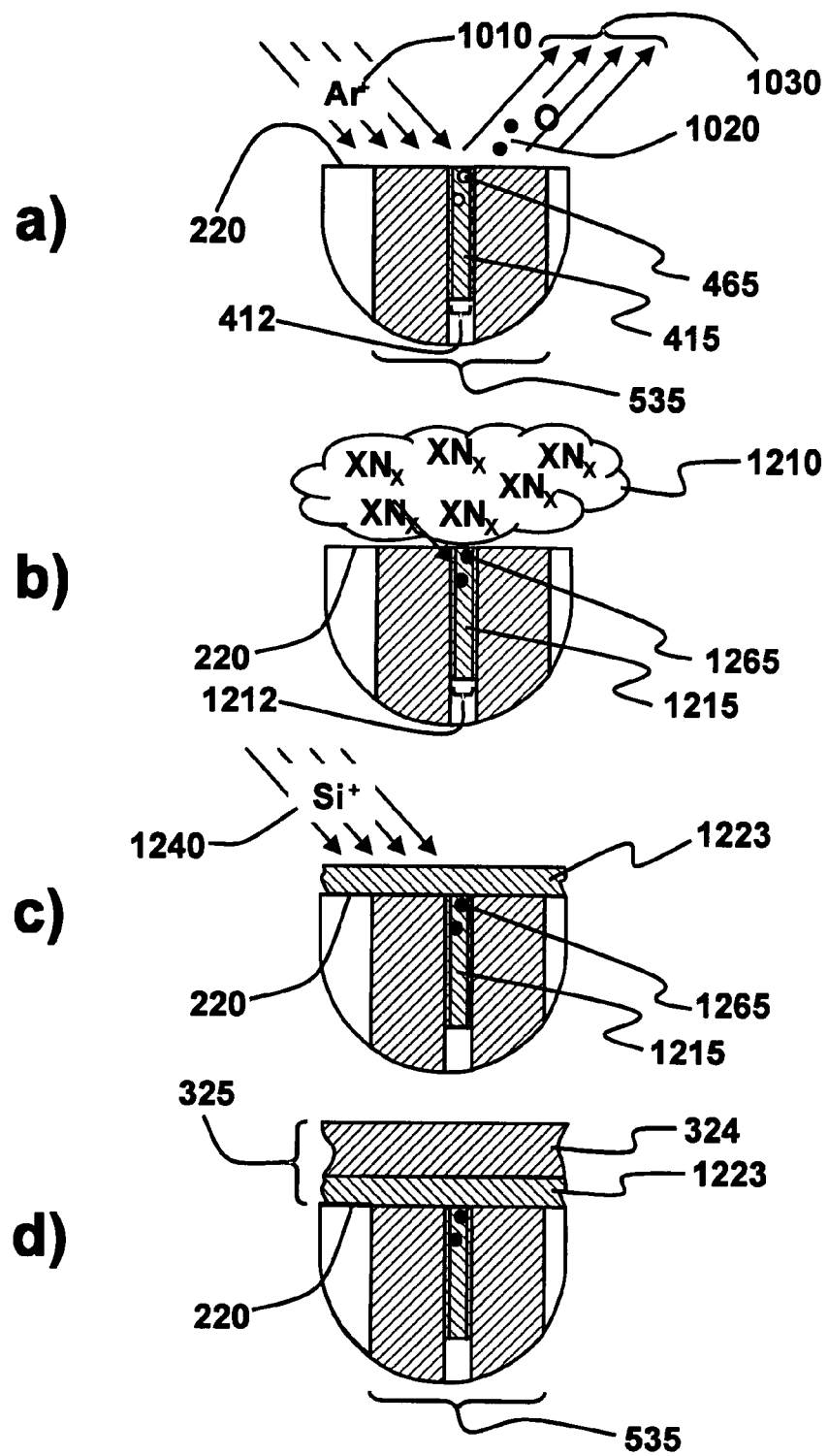
FIG. 12(a-d) are cross-sections of a detail of an HDD slider at process steps of fabrication in accordance with one embodiment of the present invention.
Figure 13:
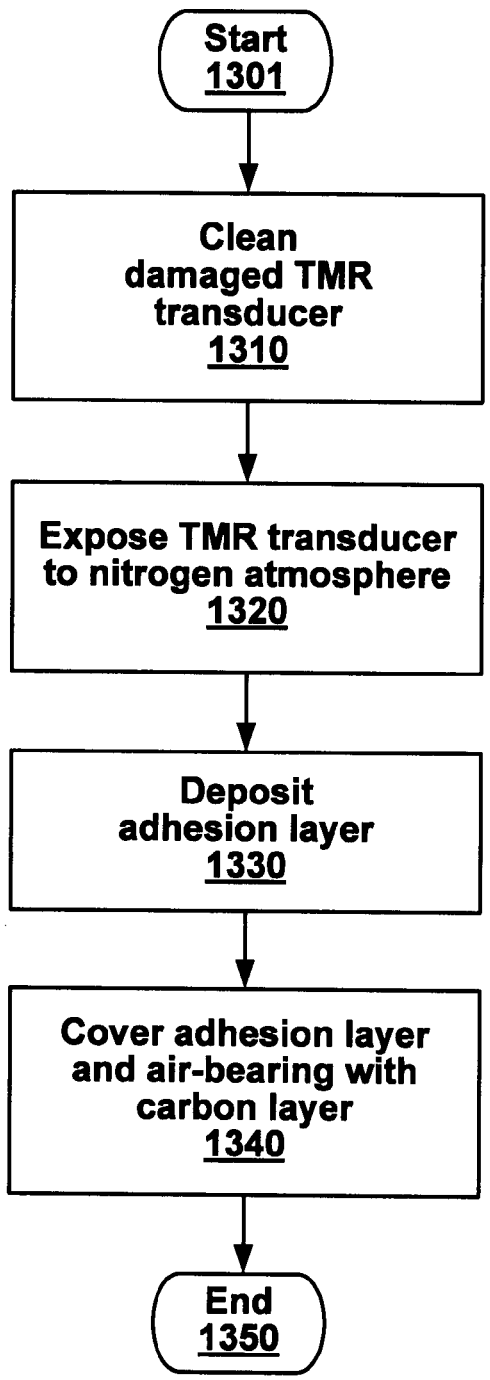
FIG. 13 is a flow chart illustrating steps of a repair and fabrication process for an HDD slider in accordance with one embodiment of the present invention.
Figure 14:
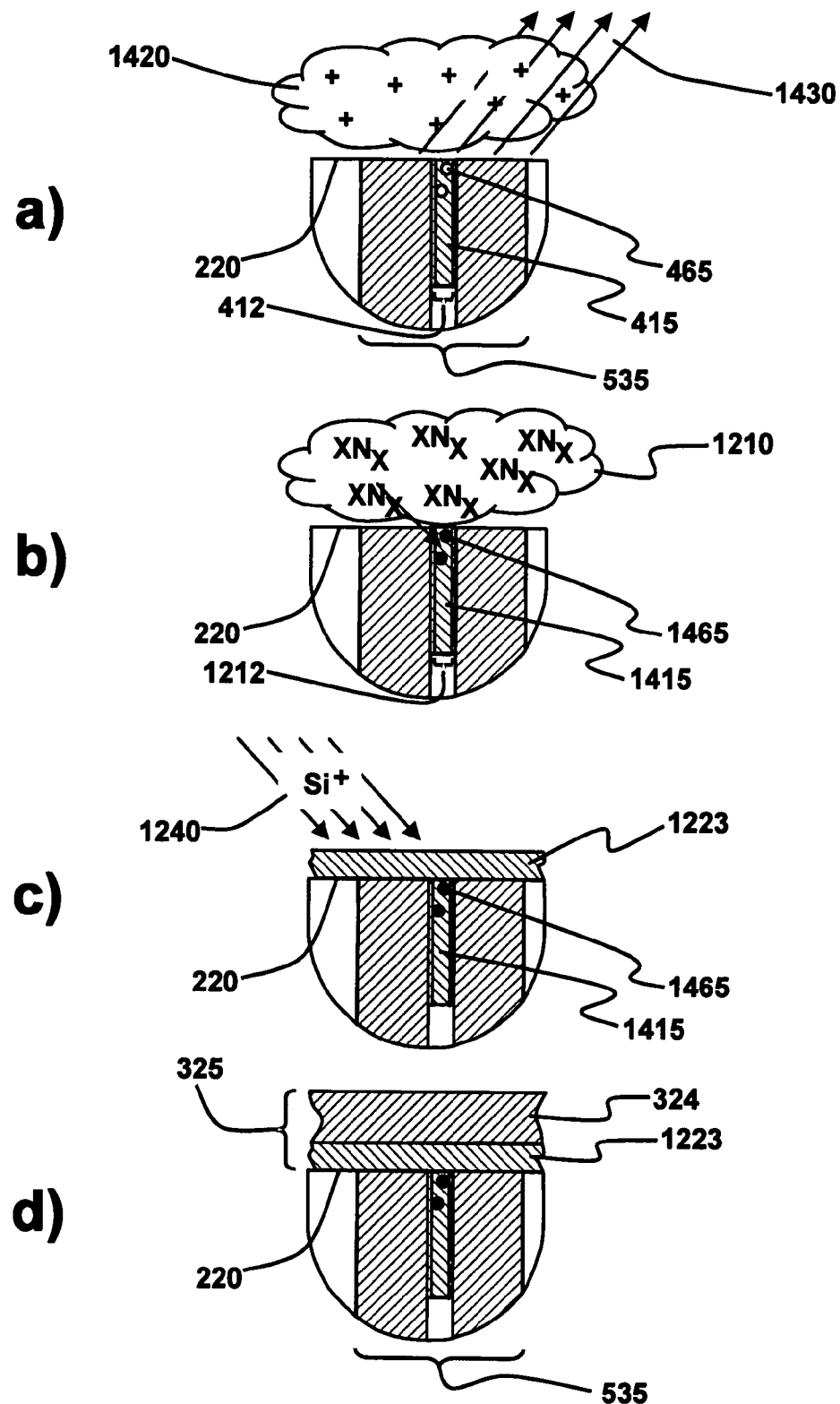
FIG. 14(a-d) are cross-sections of a detail of an HDD slider at process steps of repair and fabrication in accordance with one embodiment of the present invention.
Figure 15:
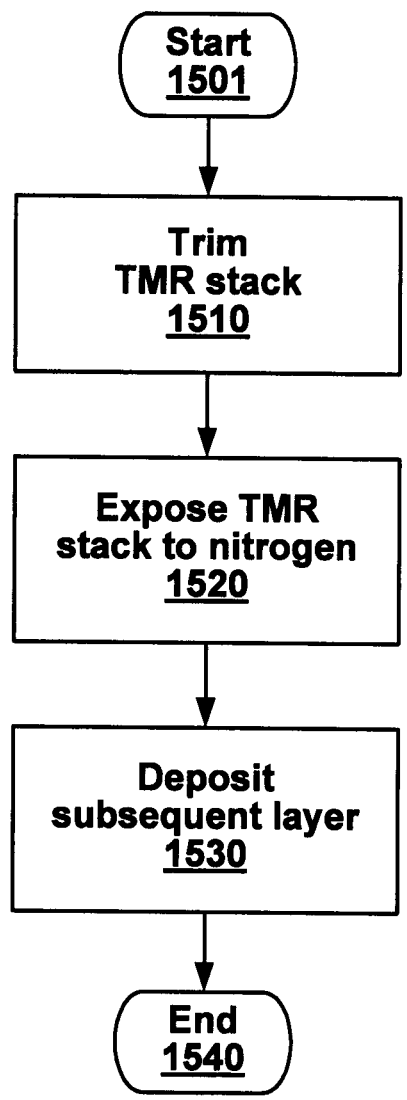
FIG. 15 is a flow chart illustrating steps of a fabrication process for a TMR transducer in accordance with one embodiment of the present invention.
Figure 16:
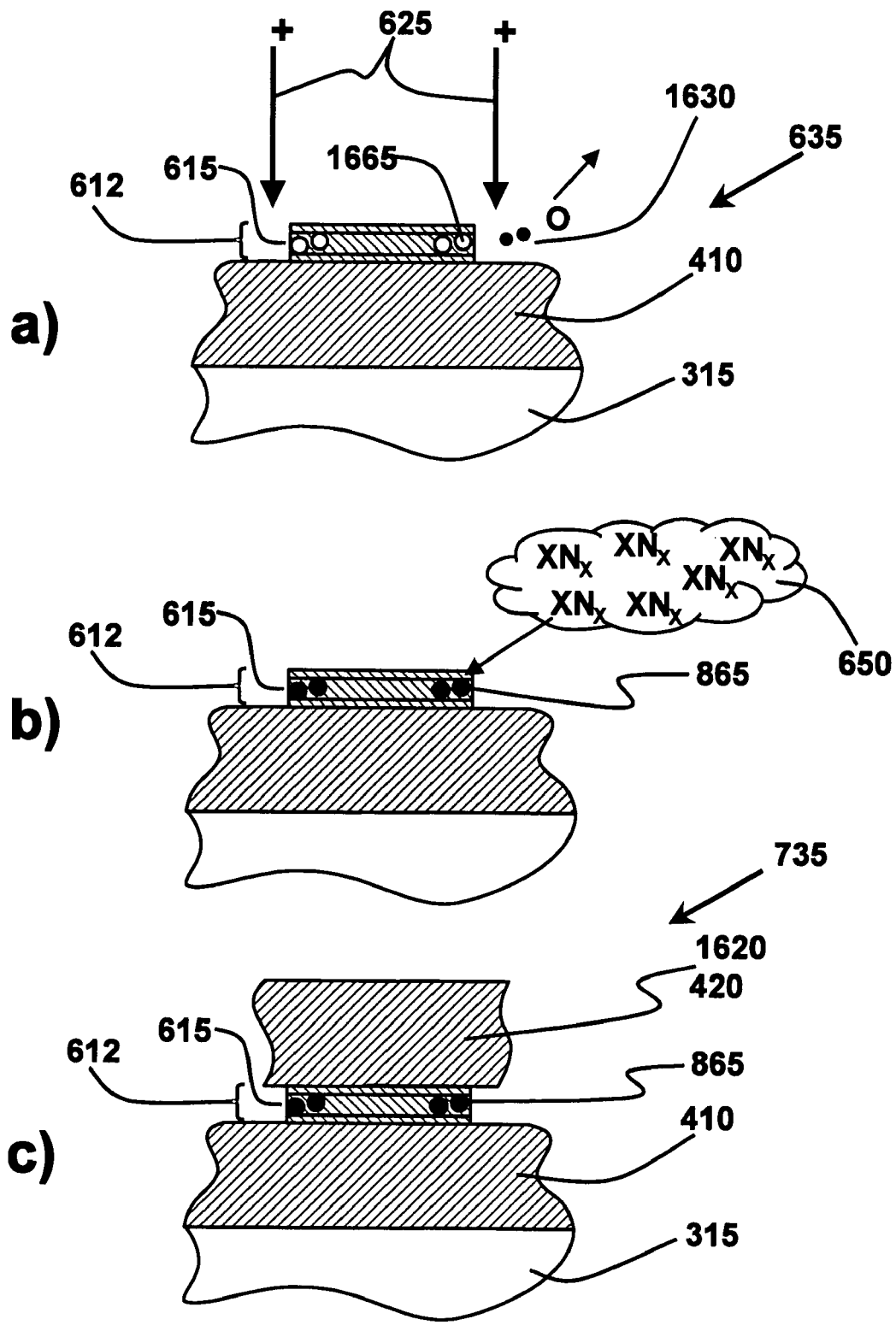
FIG. 16(a-c) are cross-sections of a detail of a TMR transducer at process steps of fabrication in accordance with one embodiment of the present invention.

With reference to FIG. 8, a cross-section 800 of a magnetic transducer of an HDD slider 125 is presented in accordance with one embodiment of the present invention. Oxygen vacancy 865 in TMR stack 612 is created by plasma 625 (FIG. 6) during the trimming of TMR stack 612 and is filled with nitrogen from atmosphere 650.

Operation

FIGS. 9, 11, 13, and 15 are flow charts of processes 900, 1100, 1300, and 1500 respectively in which particular steps are performed in accordance with embodiments of the present invention for fabricating an overcoat for a TMR transducer and repairing a TMR transducer whereby read-back signal noise is reduced in read data from the TMR transducer. FIGS. 10, 12, 14, and 16 present cross-sections of an exemplary TMR transducer at sequential process steps of fabrication presented in processes 900, 1100, 1300, and 1500 of FIGS. 9, 11, 13, and 15 respectively. Although specific steps are disclosed in processes 900, 1100, 1300, and 1500, such steps are exemplary. That is, the embodiments of the present invention are well suited to performing various other steps or variations of the steps recited in FIGS. 9, 11, 13, and 15. Within the present embodiment, it should be appreciated that the steps of processes 900, 1100, 1300, and 1500 may be performed by software, by hardware, by an assembly mechanism, through human interaction, or by any combination of software, hardware, assembly mechanism, and human interaction.

Process 900 will be described with reference to cross-section elements shown in FIGS. 10a-10c of a detail of an HDD slider at process steps of fabrication of an overcoat in accordance with one embodiment of the present invention.

In step 901 of process 900, TMR transducer 535, at a suitable level of fabrication, is introduced into process 900 in an embodiment of the present invention. A suitable level of fabrication for TMR transducer 535 is after ABS 220 has been fabricated which exposes TMR transducer 535 as part of ABS 220.

In step 910 of process 900, ABS 220 is cleaned (FIG. 10a) in an embodiment of the present invention. There are various cleaning methods available to those skilled in the art, such as non-directional plasma and directional ion beam, known as sputter etching. It is typical to perform the cleaning process in the apparatus that will deposit a subsequent layer. In accordance with an embodiment of the present invention, the subsequent layer to be deposited is adhesion layer 523. The cleaning process is typically sputter etching performed in the sputtering chamber wherein the sputter deposition of adhesion layer 523 will be performed.

The sputter etch process comprises an ionized beam of argon ($Ar^+$) gas 1010. Argon is a preferred sputter etch gas because of its relatively high atomic weight as a gas and its ability when ionized, to impart kinetic energy into a surface, thereby removing atoms from the surface being sputter etch cleaned. In the process of cleaning ABS 220, oxygen atoms (O) 1020 from insulator barrier 415 may be dislodged, along with other atoms 1030 from ABS 220, leaving oxygen vacancy 465 in insulator barrier 415 and causing damage.

In step 920 of process 900, adhesion layer 523 is deposited (FIG. 10b) in an embodiment of the present invention. An approximately stoichiometric silicon-nitride ($SiN_x$) compound comprising adhesion layer 523 is deposited onto ABS 220. Various methods of depositing adhesion layer 523 are known to those skilled in the art. For example radio frequency plasma sputtering and ion beam sputtering are available for depositing approximately stoichiometric silicon-nitride. With any acceptable deposition method a plasma comprising $Si^+$ and $N^+$ 1040 impinges upon ABS 220. Thusly, adhesion layer 523 is coupled to ABS 220. As adhesion layer 523 is deposited, nitrogen atoms from plasma $Si^+$ and $N^+$ 1040 repair TMR stack 512 such as by filling oxygen vacancy 565 in insulator barrier 515. Resulting adhesion layer 523 has a resistivity between $10^9$ Ohm-cm and $10^{14}$ Ohm-cm, a density between 2.95 g/cm$^3$ to 3.15 g/cm$^3$, and hardness between 18 GPa and 25 GPa.

In step 930 of process 900, carbon layer 324 is applied to ABS 220 and adhesion layer 523 (FIG. 10c) in an embodiment of the present invention. Accordingly, ABS 220 is covered with overcoat 325. Various methods of applying overcoat 325 are known to those skilled in the art. For example ion beam sputter deposition may be used to deposit a hydrogenated amorphous carbon layer; chemical vapor deposition (CVD) may be used to deposit a carbon layer; and filtered cathodic arc deposition may be used to deposit a tetrahedral amorphous carbon layer. The typical overcoat comprises adhesion layer 523 and carbon layer 324. The scope of the embodiment of the present invention is not limited by the method used for applying an overcoat. These application methods and the resulting overcoat are not intended to be an extensive list but are presented only as examples for the sake of brevity and clarity.

In step 940 of process 900, TMR transducer 535 is removed from process 900, whereby a slider overcoat process for noise reduction of the TMR magnetic transducer is complete.

Process 1100 will be described with reference to cross-section elements shown in FIGS. 12a-12d of a detail of an HDD slider at process steps of fabrication of an overcoat in accordance with one embodiment of the present invention.

In step 101 of process 100, TMR transducer 535, at a suitable level of fabrication, is introduced into process 1100 in an embodiment of the present invention. A suitable level of fabrication for TMR transducer 535 is after ABS 220 has been fabricated which exposes TMR transducer 535 as part of ABS 220.

In step 1110 of process 1100, ABS 220 is cleaned (FIG. 12a) in an embodiment of the present invention. There are various cleaning methods available to those skilled in the art, such as non-directional plasma and directional ion beam, known as sputter etching. It is typical to perform the cleaning process in the apparatus that will deposit a subsequent layer. In accordance with an embodiment of the present invention, the subsequent layer to be deposited is adhesion layer 1223. The cleaning process is typically sputter etching performed in the sputtering chamber wherein the sputter deposition of adhesion layer 1223 will be performed.

The sputter etch process comprises an $Ar^+$ plasma 1010. Argon is a preferred sputter etch gas because of its relatively high atomic weight as a gas and its ability when ionized, to impart kinetic energy into a surface, thereby removing atoms from the surface being sputter etch cleaned. In the process of cleaning ABS 220, oxygen atoms (O) 1020 from insulator barrier 415 may be dislodged, along with other atoms 1030 from ABS 220, leaving oxygen vacancy 465 in insulator barrier 415. Since ABS 220 is being cleaned, damage to TMR stack 412, such as oxygen vacancy 465 typically occurs closest to ABS 220.

In step 1120 of process 1100, ABS 220 is exposed to atmosphere 1210 (FIG. 12b) comprising nitrogen, such as nitrogen or nitric oxide in an embodiment of the present invention. Atmosphere 1210 comprising nitrogen is back-filled into a sputtering chamber prior to the deposition of adhesion layer 1223. The back-filling process comprises controlling the flow rate of nitrogen or nitric oxide into the sputtering chamber prior to the deposition of adhesion layer 1223 and controlling the time that TMR transducer 535 is exposed to atmosphere 1210. Nitrogen atoms from atmosphere 1210 repair TMR stack 1212, such as by filling oxygen vacancy 1265 in insulator barrier 1215.

In step 1130 of process 1100, adhesion layer 1223 (FIG. 12c) comprising Si is deposited onto ABS 220 in an embodiment of the present invention. Various methods of depositing adhesion layer 1223 are known to those skilled in the art. For example radio frequency plasma sputtering and ion beam sputtering are available for depositing silicon. With any acceptable deposition method a plasma comprising $Si^+$ 1240 impinges upon ABS 220. Thusly, adhesion layer 1223 is coupled to ABS 220.

In step 1140 of process 1100, carbon layer 324 is applied to ABS 220 and adhesion layer 1223 (FIG. 12d) in an embodiment of the present invention. Accordingly, ABS 220 is covered with overcoat 325. Various methods of applying overcoat 325 are known to those skilled in the art. For example ion beam sputter deposition may be used to deposit a hydrogenated amorphous carbon layer; chemical vapor deposition (CVD) may be used to deposit a carbon layer; and filtered cathodic arc deposition may be used to deposit a tetrahedral amorphous carbon layer. The typical overcoat comprises adhesion layer 1223 and carbon layer 324. The scope of the embodiment of the present invention is not limited by the method used for applying an overcoat. These application methods and the resulting overcoat are not intended to be an extensive list but are presented only as examples for the sake of brevity and clarity.

In step 1150 of process 1100, TMR transducer 535 is removed from process 1100, whereby a slider overcoat process for noise reduction of the TMR magnetic transducer is complete.

Process 1300 will be described with reference to cross-section elements shown in FIGS. 14a-14d of a detail of an HDD slider at process steps of repair of TMR stack 412 and fabrication of overcoat 325 in accordance with one embodiment of the present invention.

In step 1301 of process 1300, TMR transducer 535, at a suitable level of fabrication, is introduced into process 1300 in an embodiment of the present invention. A suitable level of fabrication for TMR transducer 535 is after ABS 220 has been fabricated which exposes TMR transducer 535 as part of ABS 220, and after TMR stack 412 has been damaged, such as with oxygen vacancy 465.

In step 1310 of process 1300, damaged TMR transducer 535 is cleaned (FIG. 14a and alternatively FIG. 12a) in an embodiment of the present invention. There are various cleaning methods available to those skilled in the art, such as non-directional plasma and directional ion beam, known as sputter etching. Cleaning in step 1310 is required to remove possible contamination from TMR transducer 535 prior to the deposition of subsequent adhesion layer 1223.

The non-directional plasma process could be less vigorous than a typical sputter etching process. It is usually classified as low damage plasma etching. Both non-directional plasma such as low damage plasma and sputter etching are well known in the art. Non-directional plasma with ionized atmosphere 1420 could be less aggressive than sputter etching and is less likely to cause any further damage to TMR stack 412, such as affecting oxygen vacancy 465.

In accordance with an embodiment of the present invention, and presented in FIG. 14a, step 1310 comprises non-directional plasma. Non-directional plasma comprises an ionized atmosphere 1420, typically comprising ionized gases or mixture of argon, or nitrogen, or oxygen. Ionized atmosphere 1420 chemically reacts with possible contamination on TMR transducer 535 and reacted contaminants are vented in exhaust 1430.

In accordance with an embodiment of the present invention, and presented in FIG. 12a, step 1310 comprises sputter etching. Sputter etching comprises highly energetic ions of $Ar^+$ 1010, which impinge upon an ABS 220 and TMR transducer 535 to dislodge atoms of possible contamination.

In step 1320 of process 1300, TMR transducer 535 is exposed to atmosphere 1210 (FIG. 14b) comprising nitrogen, such as nitrogen gas, nitric oxide gas, nitrogen plasma, or nitric oxide plasma in an embodiment of the present invention. Atmosphere 1210 comprising nitrogen is back-filled into a sputtering chamber prior to the deposition of adhesion layer 1223. The back-filling process comprises controlling the flow rate of nitrogen or nitric oxide into the sputtering chamber prior to the deposition of adhesion layer 1223 and controlling the time that TMR transducer 535 is exposed to atmosphere 1210. Nitrogen atoms from atmosphere 1210 repair TMR stack 1212, such as by filling oxygen vacancy 1465 in insulator barrier 1415.

In step 1330 of process 1300, adhesion layer 1223 (FIG. 14c) comprising Si is deposited onto ABS 220, which comprises TMR transducer 535, in an embodiment of the present invention. Various methods of depositing adhesion layer 1223 are known to those skilled in the art. For example radio frequency plasma sputtering and ion beam sputtering are available for depositing silicon. With any acceptable deposition method aplasma comprising $Si^+$ 1240 impinges upon ABS 220. Thusly, adhesion layer 1223 is coupled to ABS 220.

In step 1340 of process 1300, carbon layer 324 is applied to ABS 220 and adhesion layer 1223 (FIG. 14d) in an embodiment of the present invention. Accordingly, ABS 220 is covered with overcoat 325. Various methods of applying overcoat 325 are known to those skilled in the art. For example ion beam sputter deposition may be used to deposit a hydrogenated amorphous carbon overcoat; chemical vapor deposition (CVD) may be used to deposit carbon layer; and filtered cathodic arc deposition may be used to deposit a tetrahedral amorphous carbon layer. The typical overcoat comprises adhesion layer 1223 and carbon layer 324. The scope of the embodiment of the present invention is not limited by the method used for applying a carbon overcoat. These application methods and the resulting overcoat are not intended to be an extensive list but are presented only as examples for the sake of brevity and clarity.

In step 1350 of process 1300, TMR transducer 535 is removed from process 1300, whereby the TMR transducer of an HDD slider is repaired and an overcoat process is complete for noise reduction of the TMR magnetic transducer.

Process 1500 will be described with reference to cross-section elements shown in FIGS. 16a-16c of a detail of a TMR transducer at process steps of fabrication in accordance with one embodiment of the present invention.

In step 1501 of process 1500, TMR transducer 635, at a suitable level of fabrication, is introduced into process 1500 in an embodiment of the present invention. A suitable level of fabrication for TMR transducer 635 is after TMR stack 612 is deposited onto first ferromagnetic lead 410 and prior to the deposition of subsequent layer 1620.

In step 1510 of process 1500, TMR stack 612 is trimmed (FIG. 16a) in an embodiment of the present invention. There are various trimming methods available to those skilled in the art, such as ion milling, and reactive ion etching (RIE). Trimming is performed through a photolithographic pattern, well known in the art, but not presented for the sake of brevity and clarity. In accordance with an embodiment of the present invention, subsequent layer 1620 to be deposited is second ferromagnetic lead 420 (FIG. 4 and FIG. 16c).

TMR stack 612 may be damaged in the trimming process. Such damage can possibly be oxygen atoms, (O) 1630 dislodged from insulator barrier 615, leaving oxygen vacancy 1665 in insulator barrier 615. Oxygen vacancy 1665 can cause noise to increase in read data from TMR transducer 735.

In step 1520 of process 1500, TMR stack 612 is exposed to atmosphere 650 (FIG. 6 and FIG. 16b) comprising nitrogen in an embodiment of the present invention. Atmosphere 650 comprising nitrogen is back-filled into a sputtering chamber prior to the deposition of subsequent layer 1620 such as second ferromagnetic lead 420 (FIGS. 7, 8, and 16c). The back-filling process comprises controlling the flow rate of nitrogen or nitric oxide into the sputtering chamber and controlling the time that TMR transducer 535 is exposed to atmosphere 650 prior to the deposition of subsequent layer 1620 such as second ferromagnetic lead 420 (FIG. 4).

In step 1530 of process 1500, a subsequent layer 1620 (FIG. 16c) is deposited in an embodiment of the present invention. In accordance with an embodiment of the present invention, subsequent layer 1620 comprises second ferromagnetic lead 420. Subsequent layer 1620 may be any layer deposited on top of TMR stack 612, such as an adhesion layer of Si or an encapsulating layer such as alumina, but for the sake of brevity and clarity only second ferromagnetic lead 420 is discussed.

In step 1540 of process 1500, TMR transducer 735 is removed from process 1500, whereby the repair of TMR stack 612 of TMR transducer 735 is complete.

The present invention, in the various presented embodiments allows for the reduction of read-back signal noise in the read data from a TMR magnetic transducer. The reduction of read-back signal noise is accomplished in a cost effective manner by processing the TMR magnetic transducer with nitrogen compounds and/or atmospheres, which fill oxygen vacancy created in the insulator barrier by prerequisite cleaning processes.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A hard disk drive slider comprising:
   a tunneling magnetoresistance transducer of a hard disk drive slider, wherein said tunneling magnetoresistance transducer comprises;
   an insulator barrier, wherein a nitrogen atom adjacent to the insulator barrier from a nitrogen atmosphere occupies an oxygen atom vacancy within said insulator barrier, such that noise when reading data from said tunneling magnetoresistance transducer is reduced.

2. The hard disk drive slider of claim 1 wherein said insulator barrier comprises a compound containing oxygen.

3. The hard disk drive slider of claim 1 wherein said insulator barrier comprises approximately stoichiometric magnesium oxide, titanium dioxide, or alumina.

4. The hard disk drive slider of claim 1 wherein said tunneling magnetoresistance transducer comprises a first ferromagnetic lead.

5. The hard disk drive slider of claim 1 wherein said tunneling magnetoresistance transducer comprises a second ferromagnetic lead.

6. The hard disk drive slider of claim 1 wherein said slider comprises an overcoat comprising carbon.

7. The hard disk drive slider of claim 6 wherein said slider comprises an adhesion layer coupled to said slider and said overcoat.

8. A hard disk drive comprising:
   a base casting for providing coupling points for components and sub-assemblies of said hard disk drive;
   a motor-hub assembly to which at least one disk is coupled allowing rotation of said disk about an axis approximately perpendicular and centered to said disk, wherein said motor-hub assembly is coupled to said base casting, wherein said disk comprises at least one surface of data tracks; and
   a slider coupled to said base casting by means of a suspension and an actuator whereby said slider is arcuately moved across said data tracks, wherein said slider comprises:
      a tunneling magnetoresistance transducer, wherein said tunneling magnetoresistance transducer comprises; and
      an insulator barrier, wherein a nitrogen atom from a nitrogen atmosphere occupies an oxygen atom vacancy within said insulator barrier, such that noise in read data from said tunneling magnetoresistance transducer is reduced.

9. The hard disk drive of claim 8 wherein said insulator barrier comprises a compound containing oxygen or nitrogen.

10. The hard disk drive of claim 8 wherein said insulator barrier comprises approximately stoichiometric magnesium oxide, titanium dioxide, or alumina.

11. The hard disk drive of claim 8 wherein said slider comprises an overcoat comprising carbon.

12. The hard disk drive of claim 8 wherein said slider comprises an adhesion layer comprising silicon.

* * * * *